United States Patent [19]

Tateishi

[11] Patent Number: 4,897,838
[45] Date of Patent: Jan. 30, 1990

[54] SEMICONDUCTOR INTEGRATED CIRCUIT DEVICE SUBJECTED TO SCAN-TESTING OF INTERNAL LOGIC FUNCTION

[75] Inventor: Akimitsu Tateishi, Tokyo, Japan

[73] Assignee: Kabushiki Kaisha Toshiba, Kawasaki, Japan

[21] Appl. No.: 175,192

[22] Filed: Mar. 30, 1988

[30] Foreign Application Priority Data

Mar. 31, 1987 [JP] Japan .................................. 82-78551

[51] Int. Cl.4 ........................................... G01R 31/28
[52] U.S. Cl. .................................................. 371/22.3
[58] Field of Search .................. 371/25, 15; 324/73 R

[56] References Cited

U.S. PATENT DOCUMENTS 4,488,259 12/1984 Mercy .
4,534,028 8/1985 Trischler ............................... 371/25
4,602,210 7/1986 Fasang et al. .
4,621,363 11/1986 Blum ...................................... 371/25
4,698,588 10/1987 Hwang et al. .
4,701,920 10/1987 Resnick et al. ....................... 371/25
4,742,293 5/1988 Koo et al. ........................... 324/73 R
4,799,004 1/1989 Mori .................................. 324/73 R

OTHER PUBLICATIONS

"Designing Digital Circuits with Easy Testable Consideration," Test Conf. pp. 98–102, S. Fumatsu, N. Wakatsuki, and A. Yamada, 1978.
"A Logic Design Structure for LSI Testability", Proc. 14th DA Conf. p. 462, E. B. Eichelberger and T. W. Williams, 1977.

Primary Examiner—Charles E. Atkinson
Attorney, Agent, or Firm—Oblon, Spivak, McClelland, Maier & Neustadt

[57] ABSTRACT

A semiconductor integrated circuit device suitable for an internal logic diagnostic test includes an input terminal pin for receiving data including test data, and an output terminal pin for generating data including operation result data of the device. An internal logic circuit of the device is divided into internal logic units. Scanning flip-flop circuits are arranged between these internal logic units. The scanning flip-flop circuits includes a first plurality of flip-flop circuits arranged along a first scanning direction between the input and output terminals, and a second plurality of flip-flop circuits branched off from each of the first flip-flop circuits and arranged along a second scanning direction. The first flip-flop circuits are preferably constituted by 2-input/2-output flip-flop circuits series-connected along the first scanning direction. Each 2-input/2-output flip-flop circuit has a first pair of scanning input and scanning output, and a second pair of scanning input and scanning output, which are selectively designated.

17 Claims, 7 Drawing Sheets

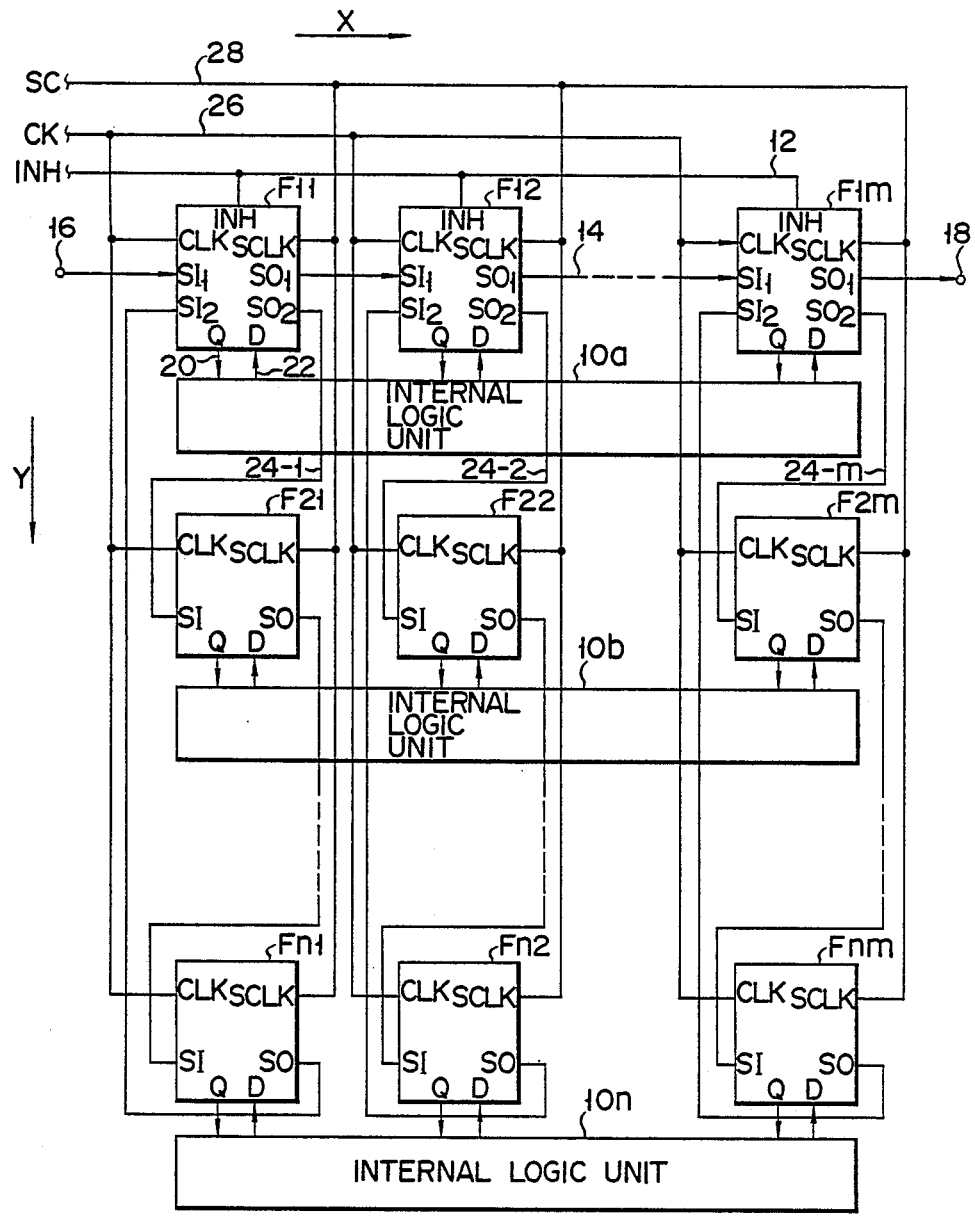
F I G. 4

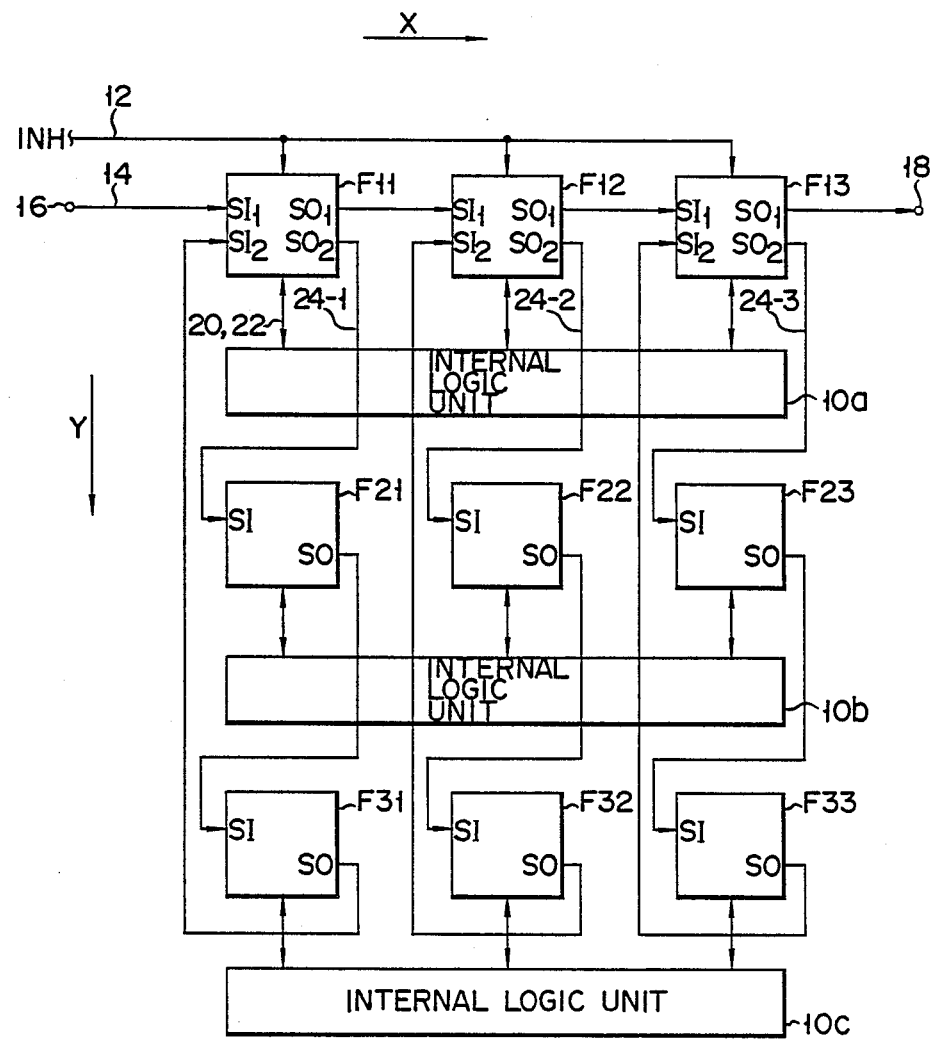
F I G. 5

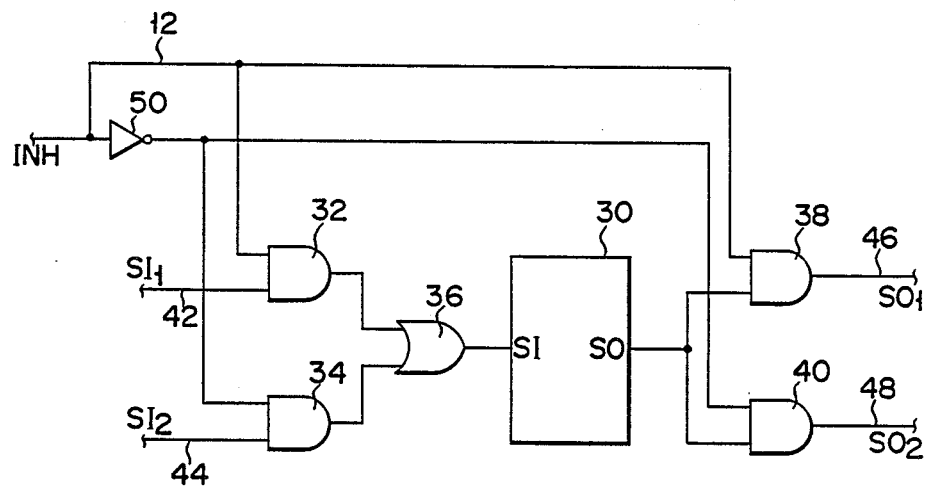
F I G. 6

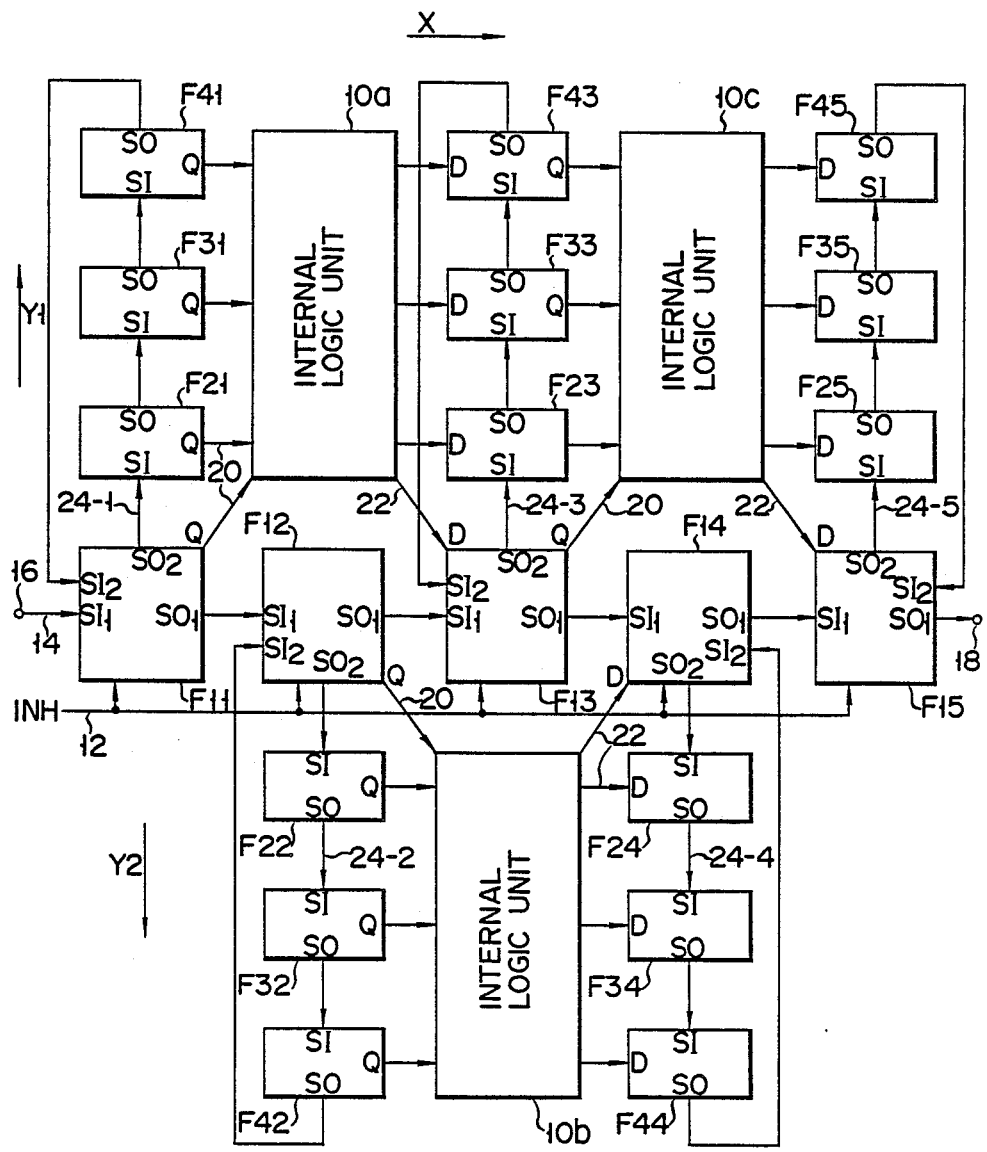
F I G. 7

SEMICONDUCTOR INTEGRATED CIRCUIT DEVICE SUBJECTED TO SCAN-TESTING OF INTERNAL LOGIC FUNCTION

BACKGROUND OF THE INVENTION

1. Field of the Invention

The present invention relates to a semiconductor integrated circuit device and, more particularly, to a semiconductor integrated circuit device suitably used for diagnosing its internal logic circuit.

2. Description of the Related Art

With the increasing needs for high performance and high integration density of semiconductor integrated circuit devices, a great difficulty has been found in formation of test data required for determination of functions of internal logic circuits in manufactured semiconductor devices and for analysis of defective parts thereof. A scanning technique for internal logic circuit diagnosis of semiconductor integrated circuit devices is known as a promising technique for performing logic diagnostic tests with a small number of input/output terminal pins used in devices. According to this test technique, when a semiconductor device under test is failed and a logically abnormal operation is caused, in order to analyze its cause, the device is normally operated after the state of its internal logic circuit is externally and directly set, and then the state of the internal logic circuit after the operation is detected, thereby performing a logic diagnostic test.

According to such a conventional internal logic circuit diagnostic test technique, however, conflicting problems are posed, i.e., it is very difficult to effectively perform an internal logic diagnosis while minimizing the number of required input/output pins of a device. Especially, when an internal logic circuit arrangement of a semiconductor device under test is divided into several circuit units and only a desired circuit unit or units selected from these units are subjected to internal circuit diagnostic tests, input/output pins must be arranged, basically, in each circuit unit in order to meet this requirement. Otherwise, test efficiency or test speed is degraded. If all the circuit units are series-connected between the respective input and output pins, the number of pins in the device can be reliably minimized. However, a test process for designating a desired unit among all the circuit units becomes complicated and takes considerable time. On the contrary, if input/output pins are arranged in every circuit unit, a process of selecting or designating a desired circuit unit is simplified. In this case, however, the total number of input/output pins of the device is undesirably increased.

SUMMARY OF THE INVENTION

It is therefore an object of the present invention to provide a new and improved semiconductor integrated circuit device.

It is another object of the present invention to provide a new and improved semiconductor integrated circuit device which allows an internal logic diagnostic test for effectively performing an internal logic diagnosis of the semiconductor integrated circuit device while decreasing the number of input/output pins of the device.

In accordance with the above objects, the present invention is addressed to a specific semiconductor integrated circuit device, which comprises an input terminal for receiving input data including test data, and an output terminal for generating data including operation result data of the device. An internal logic circuit of the semiconductor integrated circuit device is divided into internal logic units. Scanning flip-flop circuits are arranged between these internal logic units.

The scanning flip-flop circuits comprise a first plurality of flip-flop circuits arranged between the input and output terminals along a first scanning direction of the device. Data supplied from the input terminal is sequentially shifted/transferred between the first flip-flop circuits. The scanning flip-flop circuits further comprise a second plurality of flip-flop circuits branched off from each of at least two of selected flip-flop circuits of the first flip-flop circuits and arranged along a second scanning direction of the device. Data stored in at least one of the first flip-flop circuits is sequentially shifted/transferred between the second flip-flop circuits which are connected to each first flip-flop circuit.

The first flip-flop circuits are preferably constituted by 2-input/2-output flip-flop circuits series-connected along the first scanning direction. Each 2-input/2-output flip-flop circuit comprises a first pair of scanning input and scanning output and a second pair of scanning input and scanning output, each of which is selectively designated.

The present invention and its objects and advantages will become more apparent in the detailed description of preferred embodiments of the invention presented below.

BRIEF DESCRIPTION OF THE DRAWINGS

In the detailed description of preferred embodiments of the invention presented below, reference is made to the accompanying drawings of which:

FIG. 4 is a diagram showing a circuit arrangement of a main part of a semiconductor integrated circuit device according to an embodiment of the present invention;

FIG. 5 is a diagram showing a circuit arrangement of a semiconductor integrated circuit device obtained when the number of flip-flop circuits along a main scanning direction and that of flip-flop circuits along a sub-scanning direction are respectively set to be 3 in the embodiment in FIG. 4;

FIG. 6 is a diagram showing a detailed arrangement of each internal circuit of 2-input/2-output flip-flop circuits preferably used to constitute a first stage of flip-flop circuits series-connected along the main scanning direction, in FIGS. 4 and 5; and FIG. 7 is a diagram showing a circuit arrangement of a main part of a semiconductor integrated circuit device according to another embodiment of the present invention.

DETAILED DESCRIPTION OF THE PREFERRED EMBODIMENTS

Prior to the description of the internal logic diagnostic test technique according to the present invention, several conventional examples will be described with reference to FIGS. 1 to 3. This description will facilitate understanding of the present invention.

Figure 1:
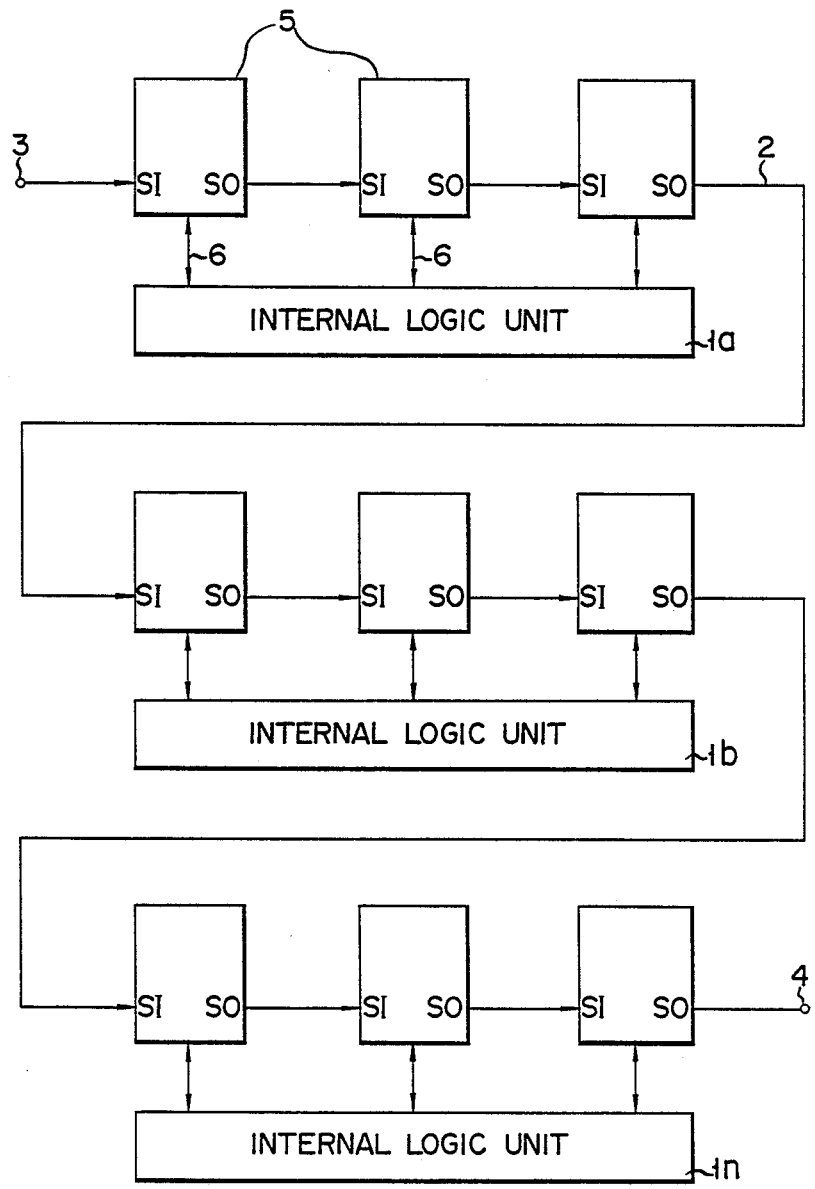
FIG. 1 is a diagram showing a circuit arrangement of a main part of a conventional semiconductor integrated circuit device to be subjected to an internal diagnostic test.

According to a conventional semiconductor integrated circuit device shown in FIG. 1, which is subjected to an internal logic circuit diagnostic test of the scanning technique, internal logic circuit units 1a, 1b, . . . , 1n (in FIG. 1, only three circuit units are illustrated for the sake of simplicity) are series-connected to scanning signal line 2 between input and output terminal pins 3 and 4. A predetermined number of scanning flip-flop circuits 5 are connected to each logic circuit unit 1 through internal input/output paths 6. Scanning flip-flop circuits 5 function as data memory circuits with respect to corresponding logic circuit unit 1.

When a desired logic circuit unit 1 of this semiconductor device is to be subjected to an internal logic diagnostic test, scanning data is externally supplied from input pin 3 of scanning signal line 2. The scanning data are sequentially set in scanning flip-flop circuits 5. Each scanning data is transferred to a corresponding one of logic circuit units 1 so as to operate it. Operation result data to be output from the logic circuit unit upon completion of the operation is set in each scanning flip-flop circuit associated with the logic circuit unit. Then, the operation result data are sequentially output from output pin 4 of scanning signal line 2, and are compared with normal operation data which represent normal logic operations and serve as expected values.

According to this conventional circuit arrangement, however, even when only a single desired logic circuit unit among all the logic circuit units is preferably subjected to an internal logic diagnostic test, data shifting must be performed for all the flip-flop circuits 5. For this reason, when a large-sized semiconductor device having a large number of flip-flop circuits 5 is to be tested, an additional period of time must be consumed for scan-in/-out processing for performing the above-described partial internal logic diagnostic test, thereby greatly degrading test efficiency.

Figure 2:
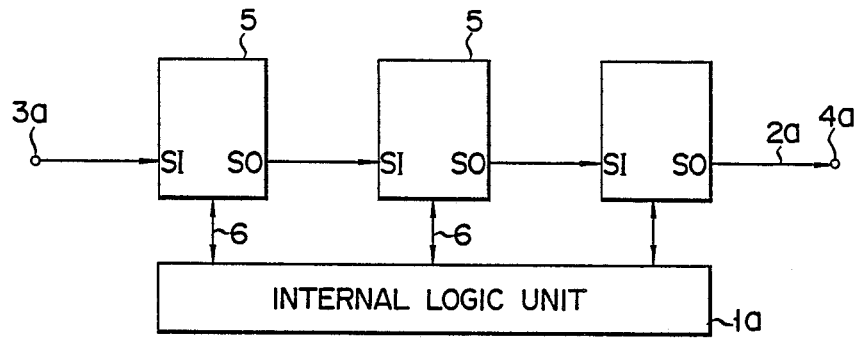
FIG. 2 is a diagram showing a circuit arrangement of a main part of another conventional semiconductor integrated circuit device to be subjected to an internal diagnostic test.
Figure 2:
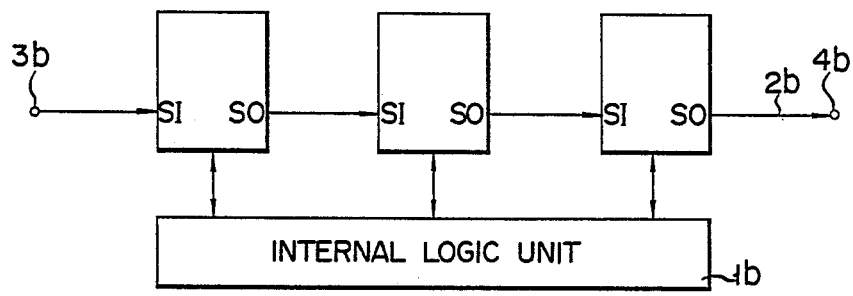
Figure 2:
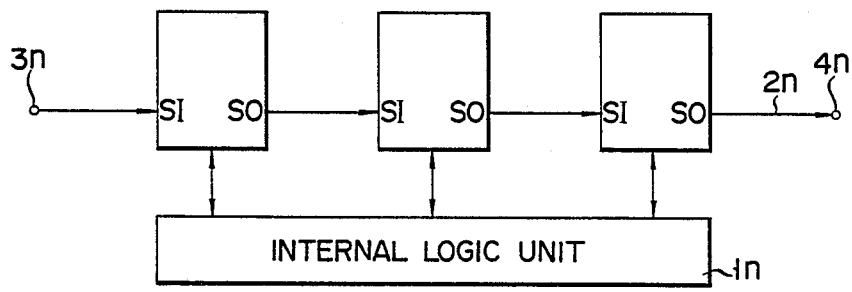

According to another conventional example shown in FIG. 2, internal logic circuit units 1a, 1b, . . . , 1n are connected in parallel to each other. More specifically, exclusive scanning signal lines 2a, 2b, . . . , 2n are respectively provided to internal logic circuit units 1a, 1b, . . . , 1n, and input and output pins 3i and 4i are arranged on each scanning line 2i. Internal logic unit 1a is connected to flip-flop circuits 5 arranged on scanning signal line 3a having input and output pins 3a and 4a through internal input/output data paths 6. Similarly, internal logic unit 1b is connected to flip-flop circuits 5 arranged on scanning signal line 3b having input and output pins 3b and 4b through internal input/output data paths 6.

According to this example, since all internal logic circuit units 1a, 1b, . . . , 1n are connected in parallel to each other in the semiconductor device such that each internal logic unit has exclusive input and output pins 3i and 4i, a partial internal logic diagnostic test can be effectively performed with respect to a desired internal logic circuit unit (e.g., internal logic unit 1b). However, the total number of input and output pins 3 and 4 of a semiconductor device is extremely increased.

Figure 3:
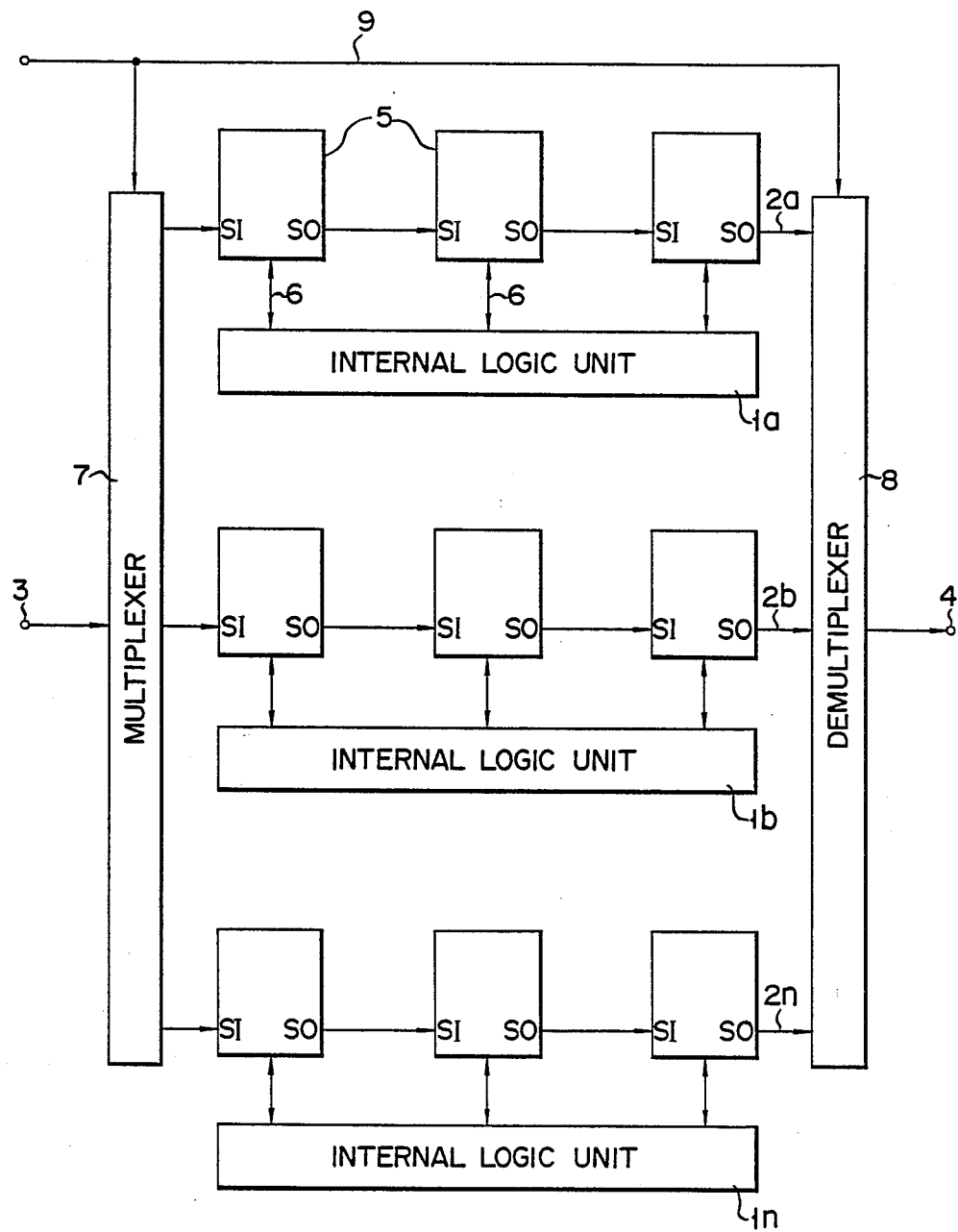
FIG. 3 is a diagram showing a circuit arrangement of a main part of still another conventional semiconductor integrated circuit device to be subjected to an internal diagnostic test.

According to still another conventional semiconductor device shown in FIG. 3, multiplexer 7 is connected to the input terminals of scanning signal lines 2a, 2b, . . . , 2n of internal logic units 1a, 1b, . . . , 1n. Demultiplexer 8 is connected to the output terminals of scanning signal lines 2a, 2b, . . . , 2n. Scanning path selection signal line 9 is commonly connected to multiplexer 7 and demultiplexer 8. A signal line of a desired internal logic unit can be designated or selected from scanning signal lines 2a, 2b, . . . , 2n of internal logic units 1a, 1b, . . . , 1n using multiplexer 7 and demultiplexer 8. In addition, the number of input and output pins 3 and 4 of the device can be minimized. According to this circuit arrangement, however, multiplexer 7 and demultiplexer 8 having different circuit arrangements must be used depending on the number of scanning paths, and hence the internal circuit arrangement of the device is unnecessarily complicated.

The above-described problems of the conventional devices can be effectively solved by semiconductor integrated circuit devices according to the embodiments of the present invention to be described below.

Referring now to FIG. 4, in a semiconductor integrated circuit device according to the preferred embodiment of the present invention, its internal logic circuitry is divided into internal logic units (or called "internal logic blocks") 10a, 10b, . . . , 10n. A predetermined number of flip-flop circuits F are provided for each internal logic unit 10 as data memory circuits. Each of flip-flop circuits F11, F12, . . . , F1m for first internal logic unit 10a has two scanning inputs SI1 and SI2 and two outputs SO1 and SO2. Selection terminals INH of flip-flop circuits F11, F12, . . . , F1m are connected to common selection signal line 12. In response to selection signal INH supplied by signal line 12, flip-flop circuits F11, F12, . . . , F1m can independently switch two scanning input/output pairs SI1 and SO1, and SI2 and SO2. In other words, each of flip-flop circuits F11, F12, . . . , F1m has two input/output paths and can select one of them as required. The flip-flop circuits provided for other internal logic units 10b, . . . , 10n are normally constituted by scanning flip-flop circuits.

Flip-flop circuits F11, F12, . . . , F1m are connected in series along scanning signal line 14 (i.e., along main scanning direction X) provided between input and output terminal pins 16 and 18 of the semiconductor device. Each of flip-flop circuits F11, F12, . . . , F1m is connected to a corresponding one of the internal logic units at its terminals Q and D through input/output data buses 20 and 22.

According to the arrangement of the flip-flop circuits in FIG. 4, each of flip-flop circuits F11, F12, . . . , F1m is connected to an array of normal type flip-flop circuits arranged in a direction opposite to main scanning direction X, i.e., subscanning direction Y perpendicular to main scanning direction X, which are respectively connected to different internal logic units in the device of this embodiment. More specifically, an array of normal type flip-flop circuits F21, . . . , Fn1 is added to flip-flop circuit F11, and is series-connected along subscanning direction Y through subscanning signal line 24-1. In this case, one of two scanning outputs SO1 and SO2 of first stage flip-flop circuit F11, e.g., second scanning output SO2 is connected to scanning input SI of next stage flip-flop circuit F21. Similarly, an array of normal flip-flop circuits F22, . . . , Fn2 is added to flip-flop circuit F12, and is series-connected along subscanning direction Y through subscanning signal line 24-2. Scanning output SO of each of last stage flip-flop circuits Fn1, Fn2, ..., Fnm of each array of normal flip-flop circuits is connected to a corresponding one of scanning inputs SI1 and SI2, e.g., second scanning input SI2 of a corresponding one of flip-flop circuits F11, F12, ..., F1m of the first state, to which the corresponding array is connected. That is, each flip-flop array in direction Y is connected in a closed loop. System clock signal line 26 is connected to all flip-flop circuits F11, ..., Fnm at their clock input terminals CLK. Scanning clock signal line 28 is connected to all flip-flop circuits F11, ..., Fnm at their scanning clock input terminals SCLK.

An operation mode in the semiconductor device arranged in the above-described manner will be described below, wherein an internal logic unit diagnostic test is performed with respect to a desired internal logic unit which is selected as a unit under test. When data shifting operation (X-direction data shifting) is to be performed, first scanning input/output paths SI1 and SO1 of flip-flop circuits F11, F12, ..., F1m are designated by setting selection signal INH at logic level "0". Accordingly, X-direction data shifting is performed by using first scanning input/output paths SI1 and SO1 of flip-flop circuits F11, F12, ..., F1m. When shifting operation in the different direction, i.e., Y-direction data shifting is to be performed, second scanning input/output paths SI2 and SO2 of flip-flop circuits F11, F12, ..., F1m are designated by setting selection signal INH at logic level "1". Accordingly, Y-direction data shifting is performed by using second scanning input/output paths SI2 and SO2 of flip-flop circuits F11, F12, ..., F1m and scanning terminals SI and SO of normal flip-flop circuits F2l, ..., F2n.

A test method on scanning signal line 14, i.e., in main scanning direction X, is the same as that in the above-described conventional methods: test data are sequentially transferred through flip-flop circuits F11, F12, ..., F1m. When a test in subscanning direction Y is to be performed, test data is transferred, by setting selection signal INH at logic "0", to a desired flip-flop circuit (e.g., flip-flop circuit F12) along direction X. Then, the test data is transferred, by setting selection signal INH at logic "1", to a desired flip-flop circuit (e.g., flip-flop circuit F22) along direction Y. When selection signal INH is set at logic "1", second scanning input/output paths SI2 and SO2 are selected or designated in flip-flop circuits F11, F12, ..., F1m. Therefore, the test data shifted/transferred to flip-flop circuit F12 is output from second scanning output SO2 of flip-flop circuit F12. Then the test data is shifted/transferred through subscanning signal line 24-2 in synchronism with scanning clock signal SC, and is supplied to desired flip-flop circuit F22. As a result, the test data is finally stored in a target flip-flop circuit in internal 10c unit 10b under test. In the same manner as described above, the test data is stored in each of flip-flop circuits F21, F22, ..., F2m associated with selected internal logic unit 10b under test.

Subsequently, the semiconductor device is normally operated using each input data bus 20 of internal logic units 10 and system clock signal CK. Upon completion of this normal operation, operation result data from each of internal logic units 10 is set in each flip-flop circuit associated with a corresponding one of internal logic units 10. At this time, normal operation result data of selected internal logic unit 10b is set in each of flip-flop circuits F21, F22, ..., F2m associated therewith.

The operation result data set in flip-flop circuits F21, F22, ..., F2m are transferred to first stage flip-flop circuits F11, F12, ..., F1m using subscanning signal lines 24-1, 24-2, ..., 24-m, respectively. For example, as for flip-flop circuit F22, partial operation result data of internal logic unit 10b stored in flip-flop circuit F22 is output from its scanning output SO and supplied to second scanning input SI2 by corresponding closed-loop-shaped subscanning signal line 24-2 through scanning input and output SI and SO of a corresponding last stage flip-flop circuit.

After the operation result data of internal logic unit 10b selected in this manner are transferred to flip-flop circuits F11, F12, ..., F1m using Y-direction scanning lines 24, selection signal INH is set at logic "0" again. Therefore, the operation result data stored in flip-flop circuits F11, F12, ..., F1m are output from scanning outputs SO, and are sequentially shifted/transferred through scanning signal line 14 and supplied to output pin 18. The operation result data output from output pin 18 are compared with pre-stored normal operation data (also called "expected value"), thereby executing an internal logic diagnostic test of the semiconductor device.

In order to facilitate comparison between the present invention and the above-described conventional examples, FIG. 5 shows a circuit arrangement wherein both numbers n and m of the flip-flop circuits in the circuit arrangement of FIG. 4 are set to be 3. Similar to the circuit in FIG. 4, in this circuit, if selection signal INH is set at logic "0", first scanning input/output paths SI1 and SO1 of 2-input/2-output flip-flop circuits F11, F12, and F13 are designated; whereas if selection signal INH is set at logic "1", second scanning input/output paths SI2 and SO2 of 2-input/2-output flip-flop circuits F11, F12, and F13 are designated.

Test data are shifted/transferred through scanning signal line 14 along main scanning direction X and stored in 2-input/2-output flip-flop circuits F11, F12, and F13. When second internal logic unit 10b is to be tested, second scanning input/output paths SI2 and SO2 are designated in 2-input/2-output flip-flop circuits F11, F12, and F13, and their contents (test data) are allowed to be sequentially shifted/transferred through subscanning signal lines 24-1, 24-2, and 24-3 along subscanning direction Y. As described above, since each of subscanning signal lines 24-1, 24-2, and 24-3 is connected in a closed-loop manner to a corresponding column of flip-flop circuits F11, F21, and F31 (F12, F22, and F32, or F13, F23, and F33), data stored in, e.g., 2-input/2-output flip-flop circuit F12 may be circulated through flip-flop circuits F22, F32, F12, F22, ... along subscanning signal line 24-2, if required.

Upon completion of the normal operation of the semiconductor device, the operation result data of internal logic unit 10i under test are sequentially shifted/transferred through subscanning signal lines 24-1, 24-2, and 24-3 along subscanning direction Y, and are finally stored in 2-input/2-output flip-flop circuits F11, F12, and F13. When selection signal INH is set at logic "0" again so as to select first scanning input/output paths SI1 and SO1 of flip-flop circuits F11, F12, and F13, data are shifted/transferred through main scanning signal line 14 along main scanning direction X to be output from output pin 18.

According to the above circuit arrangement, a partial logic diagnostic test can be effectively performed with respect to a desired internal logic unit or units while the number of input and output pins 16 and 18 required for an internal logic diagnostic test of a semiconductor device is minimized. In addition, according to the circuit arrangement of the present invention, since the multiplexer and demultiplexer used in the conventional example in FIG. 3 are not used at all, its circuit arrangement can be simplified.

FIG. 6 is a detailed circuit diagram showing each internal logic arrangement of 2-input/2-output flip-flop circuits F11, F12, and F13 to be series-connected to scanning signal line 14. Each of 2-input/2-output flip-flop circuits F11, F12, and F13 includes normal type flip-flop circuit 30. First and second scanning inputs SI1 and SI2 of 2-input/2-output flip-flop circuit F11, F12, or F13 are connected to input SI of flip-flop circuit 30 through AND gates 32 and 34, and OR gate 36. Output SO of flip-flop circuit 30 is connected to first and second scanning outputs SO1 and SO2 of the corresponding 2-input/2-output flip-flop circuit through AND gates 38 and 40. First and second scanning signal lines 42 and 44 are selectively designated in response to selection signal INH described above. Scanning input data is transferred to flip-flop circuit 30 through selected scanning signal line 42 or 44. First and second scanning output lines 46 and 48 are selectively designated in response to selection signal INH. Data (operation result data) stored in this 2-input/2-output flip-flop circuit is output through designated signal line 46 or 48. Selection signal INH is supplied to AND gates 34 and 40 through Inverter 50.

When such an arrangement is compared with the conventional examples in FIGS. 1 to 3, it is found that the following effects can obtained.

According to the conventional example in FIG. 1, when only second block 1b in internal logic units 1 is to be tested, a total of 13 cycles are required, i.e., six cycles for scanning input, one cycle for a normal circuit operation, and six cycles for scanning output. In contrast to the above case, according to the present embodiment, a total of 10 cycles are required, i.e., three cycles for scanning input in direction X, one cycle for scanning input in direction Y, one cycle for a circuit operation, two cycles for scanning output in direction Y, and three cycles for scanning output in direction X. Thus, it is demonstrated that the period of time required for a test can be greatly reduced. In addition, reduction in test time becomes more conspicuous as the number of blocks of internal logic circuit is increased.

In addition, compared with the conventional example in FIG. 2, wherein for example, the total number of terminals is six, i.e., three scanning inputs and three scanning outputs, whereas the total number of terminals is three in the embodiment, i.e., one scanning input, one scanning output, and one for INH signal line, and hence an increase in number of terminal pins can also be minimized. In the conventional example in FIG. 3, although the number of terminals is increased to substantially the same degree as that in the embodiment, the number of bits of signal selection terminal 9 is increased and the multiplexer and demultiplexer are more complicated with an increase in number of scanning paths. In contrast to the above example, according to the embodiment, once data memory circuits are formed, the circuit design is not influenced by the number of scanning paths.

Thus, according to the embodiment, a test can be performed within a short period of time with respect to an arbitrary block in an internal logic circuit divided into a plurality of blocks, and an increase in number of input/output terminals can be minimized. In addition, the circuit arrangement can be simplified because a demultiplexer, a multiplexer, and the like are not required. Therefore, the present invention allows effective operation tests for internal logic circuits, and is very useful in practice.

FIG. 7 is a schematic view of an arrangement according to another embodiment of the present invention. The same reference numerals in FIG. 7 denote the same parts as in FIGS. 4 and 5, and a detailed description thereof will be omitted.

The circuit arrangement according to the second embodiment in FIG. 7 is basically different from the circuit arrangement according to the first embodiment in FIG. 4 in that normal type flip-flop circuits (F21, F31, and F41, for example) series-connected to subscanning signal line 24-$i$ branched off from each of 2-input/2-output flip-flop circuit F11, F12, F13, F14, and F15 are parallelly connected to a corresponding internal logic unit (10a, for example); and that subscanning signal line 24-$i$ branched off from an array of 2-input/2-output flip-flop circuits F11, F12, F13, F14, and F15 arranged along main scanning direction X alternately extends in the opposite directions (Y1, Y2) in subscanning direction Y.

As is clearly illustrated in FIG. 7, in an array branched off from 2-input/2-output flip-flop circuit F11, scanning flip-flop circuits F21, F31, and F41 are series-connected by closed-loop-shaped subscanning signal line 24-1. Storage data (test data) in flip-flop circuits F11, F21, F31, and F41 are parallel-transferred to internal logic unit 10a. In an array branched off from 2-input/2-output flip-flop circuit F12, scanning flip-flop circuits F22, F32, and F42 are series-connected by closed-loop-shaped subscanning signal line 24-2 along second subscanning direction Y2 opposite to first subscanning direction Y1 described above. Storage data (test data) in flip-flop circuits F12, F22, F32, and F42 are parallel-transferred to internal logic unit 10b. In an array branched off from 2-input/2-output flip-flop circuit F13, scanning flip-flop circuits F23, F33, and F43 are series-connected by closed-loop-shaped subscanning signal line 24-3 along first subscanning direction Y1. Flip-flop circuits F13, F23, F33, and F43 parallelly receive data (normal operation result data) from internal logic unit 10a. In an array branched off from 2-input/2-output flip-flop circuit F14, scanning flip-flop circuits F24, F34, and F44 are series-connected by closed-loop-shaped subscanning signal line 24-4 along second subscanning direction Y2. Flip-flop circuit F14, F24, F34, and F44 parallelly receive data (normal operation result data) from internal logic unit 10b. Circuit connections are repeatedly performed in the above-described manner to obtain the circuit arrangement in FIG. 7.

When it is desired that only, e.g., second internal logic unit 10b is subjected to an internal logic diagnostic test of the semiconductor integrated circuit device, test data of selected internal logic unit 10b under test are shifted/transferred in a manner to be described below. First, selection signal INH is set at logic "0" so as to designate first scanning input/output paths SI1 and SO1 of 2-input/2-output flip-flop circuits F11, F12, F13, F14, and F15 series-connected through main scanning signal line 14. Accordingly, test data externally supplied through input pin 16 are sequentially shifted/transferred to flip-flop circuits F11 and F12 along main scanning direction X. Selection signal INH is set at logic "1" and second scanning input and output paths SI2 and SO2 of flip-flop circuit F12, thereby allowing the data stored in flip-flop circuit F12 so as to be circulated among flip-flop circuits F22, F32, and F42 along subscanning direction Y2. As a result, the test data of internal logic unit 10b under test can be set in corresponding flip-flop circuits F12, F22, F32, and F42. The aforementioned data-shifting process is repeated, so that suitable test data is stored in flip-flop circuits F12, F22, F32, and F42 which associate selected logic circuit 10b under test.

Operation result data of selected internal logic unit 10b under test are transferred to flip-flop circuits F14, F24, F34, and F44, which constitute another array associated with internal logic unit 10b, through internal output data bus 22. Storage data in flip-flop circuits F14, F24, F34, and F44 are sequentially shifted/transferred through subscanning signal line 24-4 and supplied to first stage flip-flop circuit F14. In this case, if selection signal INH is set at logic "0" again to designate first scanning input and output paths SI1 and SO1 of flip-flop circuit F14, the operation result data are shifted/transferred through main scanning signal line 14 along main scanning direction X and are output from output pin 18.

With such an arrangement, data can be set in the data memory circuits on a corresponding scanning path of an internal logic unit under test by switching the logic levels of signal INH. The output data at this time can be output through main scanning flip-flop circuits F11, F12, F13, F14, and F15 located at the branching points. Therefore, the same effects as those in the first embodiment can be obtained.

The present invention is not limited to the above-described embodiments. Various changes and modifications can be made without departing from the gist of the present invention. For example, the directions of the scanning paths are not limited to those in FIGS. 4 and 7, but may be changed in accordance with specifications. Similarly, the arrangement of each data memory circuit having a function for switching the scanning inputs and scanning outputs is not limited to the one shown in FIG. 6, but may be changed in accordance with specifications. In the second embodiment in FIG. 7, each subscanning signal line 24-i may not be necessarily formed into a closed-loop shape. In each subscanning signal line, the feedback signal line from last stage flip-flop circuit F4i to first stage flip-flop circuit F1i can be omitted.

What is claimed is:

1. A semiconductor integrated circuit device to be subjected to an internal logic diagnostic test, comprising:
   (a) an input terminal for receiving input data including test data;
   (b) an output terminal for generating data including operation result data of said device;
   (c) an internal logic circuit device divided into internal logic units; and
   (d) a scanning circuit means for supplying the test data to said internal logic units, and for scanning said logic units, said scanning circuit means comprising,
   a first plurality of data-shifting circuits, provided between said input and said output terminals and connected in series with each other along a first scanning direction of said device, for sequentially shifting/transferring the data supplied from said input terminal between said first data-shifting circuits, and
   a second plurality of data-shifting circuits, branched off from said first data-shifting circuits and connected in series with each other along a second scanning direction of said device, for sequentially shifting/transferring data stored in at least one of said first data-shifting circuits between said second data-shifting circuits which are connected to at least one of said first data-shifting circuits.

2. The device according to claim 1, wherein said first data-shifting circuits comprise:
   2-input/2-output flip-flop circuits each of which has a first pair of scanning input and scanning output; and
   a second pair of scanning input and scanning output, which are selectively designated.

3. A device as in claim 2, wherein said second data-shifting means comprises:
   flip-flop circuits.

4. The device according to claim 3, wherein said 2-input/2-output flip-flop circuits are series-connected through said first pairs of scanning inputs and scanning outputs, whereas said second flip-flop circuits are series-connected to the scanning output of the corresponding 2-input/2-output flip-flop circuit., 5. The device according to claim 4, wherein said second flip-flop circuits are series-connected by a closed-loop-shaped signal line so that data is allowed to be circulated thereamong.

6. The device according to claim 5, wherein said internal logic units are arranged to be parallel to the first scanning direction.

7. The device according to claim 5, wherein said internal logic units are arranged to be parallel to the second scanning direction.

8. The device according to claim 5, wherein said second flip-flop circuits are branched off from each of said first flip-flop circuits.

9. A semiconductor integrated circuit device suitable for a partial internal logic diagnostic test, comprising:
   (a) an input terminal for receiving input data including test data;
   (b) an output terminal for generating data including operation result data of said device;
   (c) a main data scanning signal line, provided between said input and output terminals, for defining a main scanning direction;
   (d) an internal logic circuit divided into internal logic units; and
   (e) a plurality of arrays of flip-flop circuits connected to said internal logic units, said flip-flop circuits comprising,
   an array of main scanning flip-flop circuits of 2-input/2-output flip-flop circuits which are series-connected to said main data scanning signal line, and each of which has a first input/output path and a second input/output path to be selectively designated, and
   an array of subscanning flip-flop circuits branched off from at least two of said main scanning flip-flop circuits and having normal type flip-flop circuits series-connected along a subscanning direction substantially perpendicular to the main scanning direction; and
   (f) data transfer control means, connected to said plurality of arrays of flip-flop circuits, for, when an internal logic diagnostic test is performed with respect to a desired internal logic unit selected from said internal logic units, designating one of said first input/output path and said second input/output path of at least one of said main scanning flip-flop circuits and shifting/transferring the data supplied from said input terminal through said main scanning signal line, and for designating the other of said first input/output path and said second input/output path of said at least one of said main scanning flip-flop circuits, and shifting/transferring the data stored therein along the subscanning direction, thereby setting the data in a certain flip-flop circuit associated with said desired internal logic unit.

10. The device according to claim 9, wherein said data transfer control means comprises a subscanning signal line for series-connecting subscanning flip-flop circuits in said array.

11. The device according to claim 10, wherein said subscanning signal line electrically connects said array of subscanning flip-flop circuits in a closed loop and allows data to be circulated thereamong.

12. The device according to claim 10, wherein when operation result data of said desired internal logic unit is stored in said certain flip-flop circuit, said data transfer control means shifts/transfers the operation result data to the corresponding main scanning flip-flop circuit along the subscanning direction, initializes the designation of said first input/output path and said second input/output path of said main scanning flip-flop circuits, and sequentially shifts/transfers the operation result data among said main scanning flip-flop circuits along the subscanning direction, thereby supplying the operation result data to said output terminal.

13. The device according to claim 10, wherein said sub-scanning flip-flop circuits are branched off from each of said main scanning flip-flop circuits.

14. A semiconductor integrated circuit device suitable for a partial internal logic diagnostic test, comprising:
   (a) an input terminal for receiving input data including test data;
   (b) an output terminal for generating data including operation result data of said device;
   (c) a main data scanning signal line, provided between said input and output terminals, for defining a main scanning direction;
   (d) an internal logic circuit divided into internal logic units; and
   (e) a plurality of arrays of flip-flop circuits respectively connected to said internal logic units, said flip-flop circuits comprising, an array of main scanning flip-flop circuits of 2-input/2-output flip-flop circuits which are series-connected to said main data scanning signal line, which function as first stage flip-flop circuits of said plurality of arrays of flip-flop circuits, and each of which has a first input/output path and a second input/output path to be selectively designated, and an array of subscanning flip-flop circuits branched off from each of said main scanning flip-flop circuits, connected to the corresponding internal logic unit, and having normal type flip-flop circuits series-connected along a subscanning direction perpendicular to the main scanning direction; and (f) data transfer control means, connected to said plurality of arrays of flip-flop circuits, for, when an internal logic diagnostic test is performed with respect to a desired internal logic unit selected from said internal logic units, designating one of said first input/output path and said second input/output path of at least one of said main scanning flip-flop circuits and shifting/transferring the data supplied from said input terminal through said main scanning signal line, and for designating the other of said first input/output path and said second input/output path of said at least of said main scanning flip-flop circuits, and shifting/transferring the data stored therein along the subscanning direction, thereby setting the data in a certain flip-flop circuit associated with said desired internal logic unit.

15. The device according to claim 14, wherein said data transfer control means comprises a subscanning signal line for series-connecting said array of subscanning flip-flop circuits.

16. The device according to claim 15, wherein said subscanning signal line electrically connects said array of subscanning flip-flop circuits in a closed loop and allows data to be circulated thereamong.

17. The device according to claim 15, wherein when operation result data of said desired internal logic unit is stored in said certain flip-flop circuit, said data transfer control means shifts/transfers the operation result data to the corresponding main scanning flip-flop circuit along the subscanning direction, initializes the designation of said first input/output path and said second input/output path of said main scanning flip-flop circuits, and sequentially shifts/transfers the operation result data among said main scanning flip-flop circuits along the subscanning direction, thereby supplying the operation result data to said output terminal.

* * * * *

UNITED STATES PATENT AND TRADEMARK OFFICE
CERTIFICATE OF CORRECTION

PATENT NO. : 4,897,838
DATED : 1/30/90
INVENTOR(S) : Akimitsu Tateishi

It is certified that error appears in the above-identified patent and that said Letters Patent is hereby corrected as shown below:

Title page:

In the priority data, the following Application No. is incorrectly recorded as "82-78551". It should be --62-78551--.

Signed and Sealed this

Twentieth Day of August, 1991

*Attest:*

HARRY F. MANBECK, JR.

*Attesting Officer*    Commissioner of Patents and Trademarks